United States Patent
Lee et al.

(10) Patent No.: US 7,378,875 B2
(45) Date of Patent: May 27, 2008

(54) COMPENSATION CIRCUITS FOR UNEQUAL INPUT/OUTPUT COMMON MODE VOLTAGES

(75) Inventors: Chao-Cheng Lee, Hsin Chu (TW); Tzung-Ming Chen, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 75 days.

(21) Appl. No.: 11/273,026

(22) Filed: Nov. 14, 2005

(65) Prior Publication Data

US 2006/0103426 A1 May 18, 2006

(30) Foreign Application Priority Data

Nov. 12, 2004 (TW) .............................. 93134747 A

(51) Int. Cl.
*H03K 17/62* (2006.01)
(52) U.S. Cl. ........................................ 326/82; 327/404
(58) Field of Classification Search ................. 326/82; 327/108, 403, 404; 330/85, 104
See application file for complete search history.

(56) References Cited

U.S. PATENT DOCUMENTS

| 4,500,841 A | * | 2/1985 | Morey | .......................... 327/85 |
| 5,856,758 A | * | 1/1999 | Joffe et al. | .................... 330/85 |
| 7,012,458 B1 | * | 3/2006 | Roo | ........................... 327/404 |

* cited by examiner

*Primary Examiner*—Daniel D Chang
(74) *Attorney, Agent, or Firm*—Thomas, Kayden, Horstemeyer & Risley

(57) ABSTRACT

A circuit apparatus having compensation circuits for unequal input/output common mode voltages is presented. The apparatus includes a circuit unit, a feedback path and a current source. The circuit unit has at least an input terminal for receiving an input signal and at least an output terminal for generating an output signal. The input terminal configured to provide an input common mode voltage and the output terminal configured to provide an output common mode voltage. The feedback path couples the output terminal and the input terminal. The current source is coupled to the input terminal to supply a current. The voltage drop generated at the feedback path compensates the difference between the input common mode voltage and the output common mode voltage.

13 Claims, 6 Drawing Sheets

COMPENSATION CIRCUITS FOR UNEQUAL INPUT/OUTPUT COMMON MODE VOLTAGES

This application claims the benefit of Taiwan application Serial No. 093134747, filed Nov. 12, 2004, the subject matter of which is incorporated herein by reference.

BACKGROUND OF THE INVENTION

1. Field of the Invention

The invention relates in general to a circuit apparatus, and more particularly to an amplifier circuit apparatus having compensation circuits for unequal input/output common mode voltages.

2. Description of the Related Art

The input and output common mode voltages Vcm of a cascaded amplifier circuit are usually designed to be equal. If the input/output Vcm does not match, an AC coupling circuit should be added to prevent operation failure of the amplifier due to bias point deviation. However, when power supply voltage decreases while the input/output Vcm remains the same, available output swing is thus reduced.

In a regular wireless system, an OP-type inverting amplifier is coupled next to a mixer, whereas the input/output Vcm of the amplifier and the mixer should be the same. Otherwise, a buffer should then be added in between the mixer and the inverting amplifier to serve as a level shifter.

Therefore, the trend of providing low-voltage supplies has raised the problem of how a cascaded amplifier circuit with unequal input/output Vcm should be designed.

SUMMARY OF THE INVENTION

The present invention overcomes the disadvantages of the prior art by providing a circuit apparatus that works with unequal input/output common mode voltages.

In an embodiment, a circuit apparatus having compensation circuits for unequal input/output common mode voltages includes a circuit unit, a feedback path and a current source. The circuit unit includes at least an input terminal for receiving an input signal and at least an output terminal for generating an output signal. The input terminal configured to provide an input common mode voltage and the output terminal configured to provide an output common mode voltage. The feedback path couples the output terminal and the input terminal. The current source is coupled to the input terminal to supply a current. The voltage drop generated at the feedback path compensates the difference between the input common mode voltage and the output common mode voltage.

DETAILED DESCRIPTION OF THE INVENTION

Figure 1:
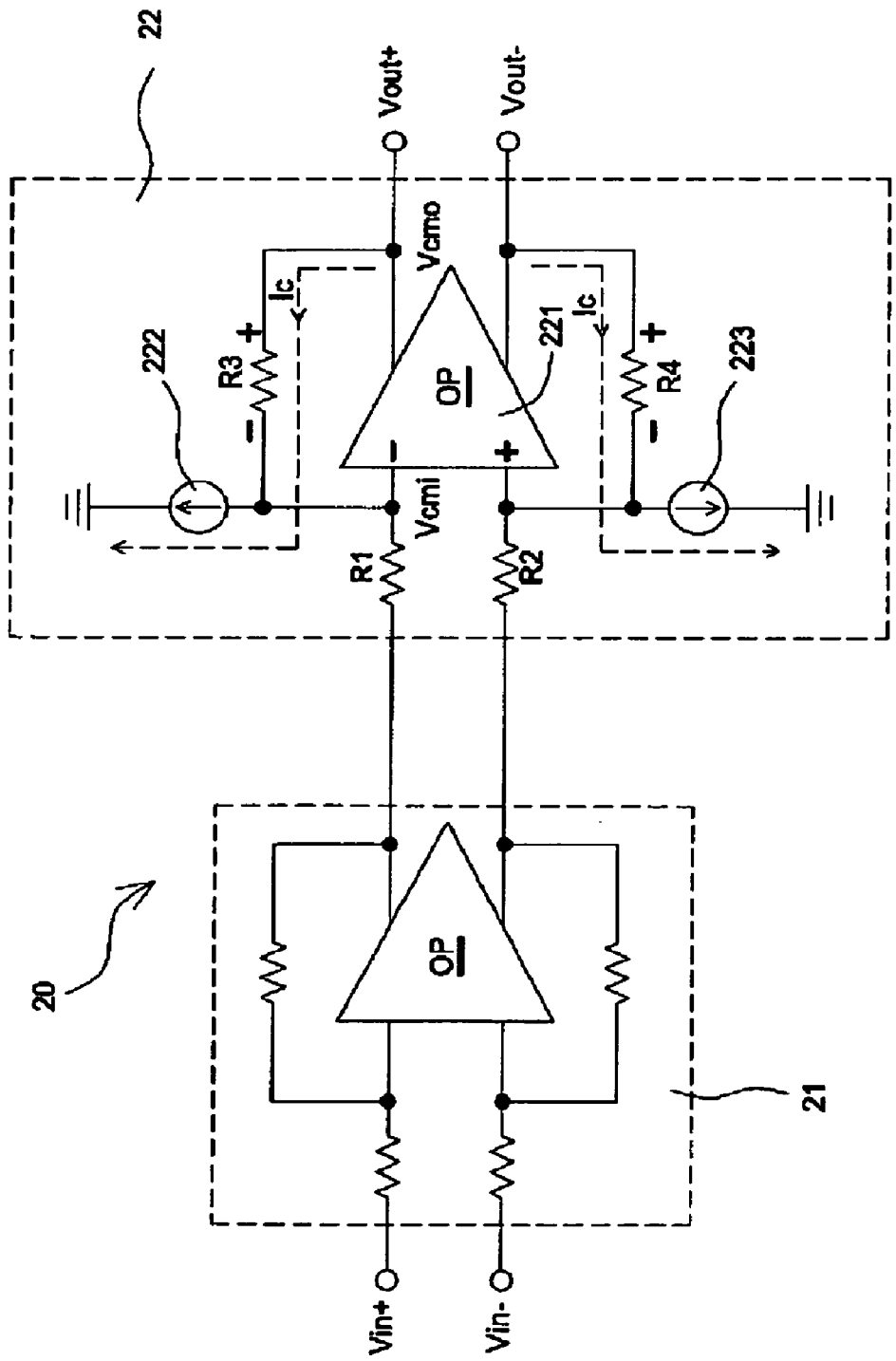
FIG. 1 is a schematic diagram of a circuit apparatus having unequal input/output common mode voltages according to an embodiment of the invention.
Figure 2:
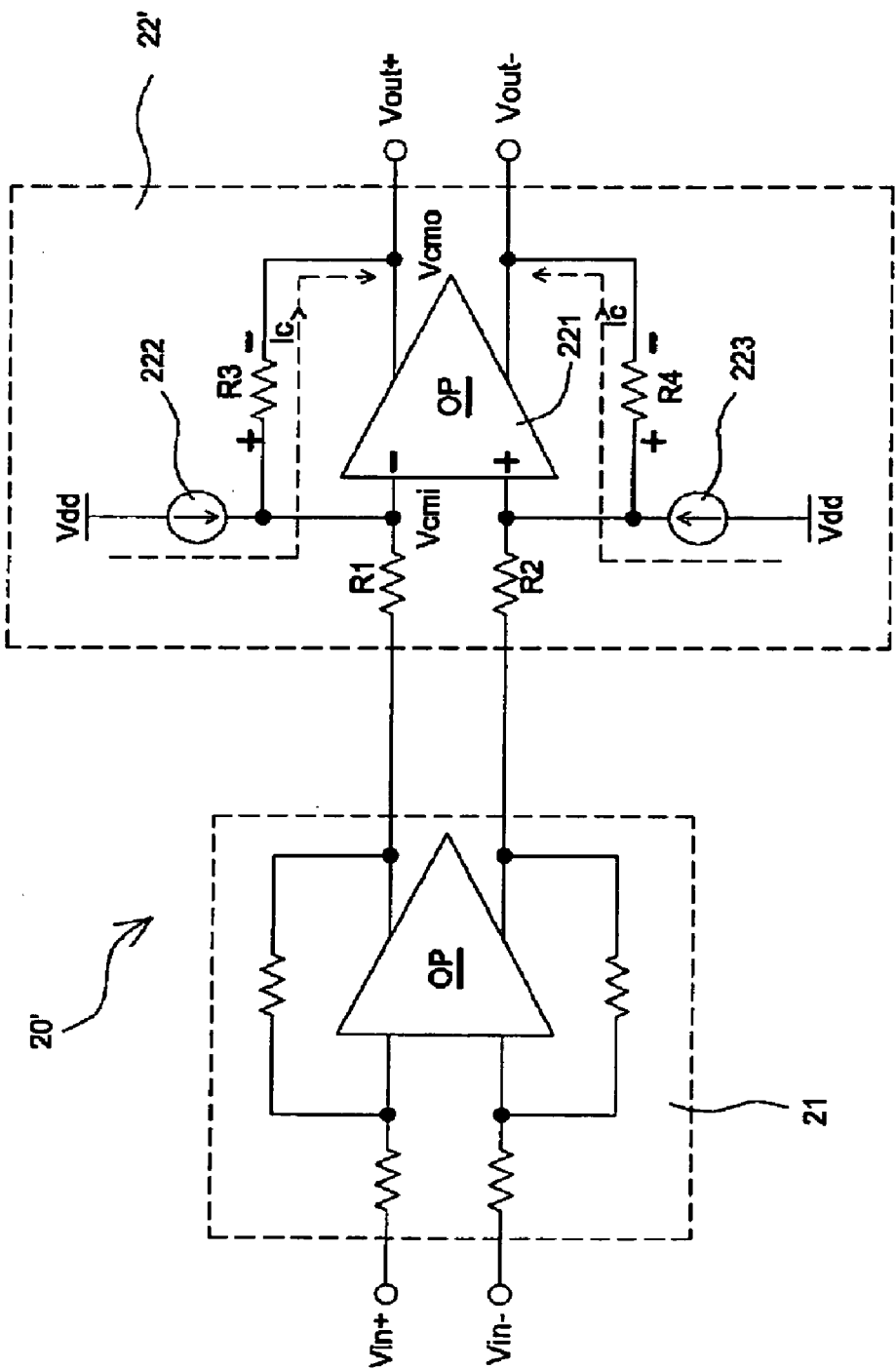
FIG. 2 is a schematic diagram of a circuit apparatus having unequal input/output common mode voltages according to another embodiment of the invention.

FIG. 1 shows a circuit apparatus having unequal input/output common mode voltages 22 according to an embodiment of the invention, wherein the Vcmo (common mode voltage at the output terminal) is higher than the Vcmi (common mode voltage at the input terminal). FIG. 2 shows a circuit apparatus having unequal input/output common mode voltages 22' according to another embodiment of the invention, wherein the Vcmo is lower than the Vcmi. As shown in FIG. 1 and FIG. 2, the circuit apparatus having unequal input/output common mode voltages 22 (22') is serially coupled to a first-stage amplifier 21 to form a cascaded amplifier 20 (20').

In the embodiment as shown in FIG. 1 and FIG. 2, the circuit apparatus having unequal input/output common mode voltages 22 (22') includes two current sources 222 and 223 in addition to a circuit unit 221 (such as an operational amplifier) and signal-amplifying impedances R1, R2, R3, and R4 (R3 and R4 are feedback impedances). The current sources 222 and 223 are coupled to the two input terminals of the operational amplifier 221 respectively in order to supply current. The voltage drop generated by the feedback impedance R3 (R4) compensates the voltage difference of the common mode voltages Vcmi and Vcmo at the input and output terminals. As those skilled in the art would know, the equivalent input resistance of an operational amplifier is relatively large, which is a lot larger than the feedback impedance R3 or R4 coupled in parallel at the same node. Therefore, most of the current will not flow into the operational amplifier and thus common mode voltage compensation can be optimized.

According to the circuit apparatus having unequal input/output common mode voltages 22 of FIG. 1, since the Vcmo at the output terminal is higher than the Vcmi at the input terminal, the terminal of the current source 222 (223) that is not coupled to the input terminal should be grounded. Therefore, the voltage drop generated by the calibration current Ic flowing through the feedback impedance R3 (R4) would result in the compensation of common mode voltage differences between the output and input terminals. The current to be generated from the current source 222 (223) is determined by the voltage difference of Vcmo and Vcmi, and the feedback impedance R3 (R4). The generated calibration current Ic should satisfy the following formula:

$$Vcmo - Vcmi = Ic \times R3;\ Vcmo - Vcmi = Ic \times R4$$

According to the circuit apparatus having unequal input/output common mode voltages 22' of FIG. 2, since the Vcmo at the output terminal is lower than the Vcmi at the input terminal, the terminal of the current source 222 (223) that is not coupled to the input terminal should be coupled to a supply source, which is Vdd in this case. Therefore, the voltage drop generated by the calibration current Ic flowing through the feedback impedance R3 (R4) would result in the compensation of common mode voltage differences between the output and input terminals. The current to be generated from the current source 222 (223) is determined by the voltage difference of Vcmo and Vcmi, and the feedback impedance R3 (R4). The generated calibration current Ic should satisfy the following formula:

$$Vcmi - Vcmo = Ic \times R3;\ Vcmi - Vcmo = Ic \times R4$$

In addition to the applications in a cascaded amplifier, the invention can also be applied to other fields, for example, the second-stage inverting amplifier coupled to a mixer 31.

Figure 3:
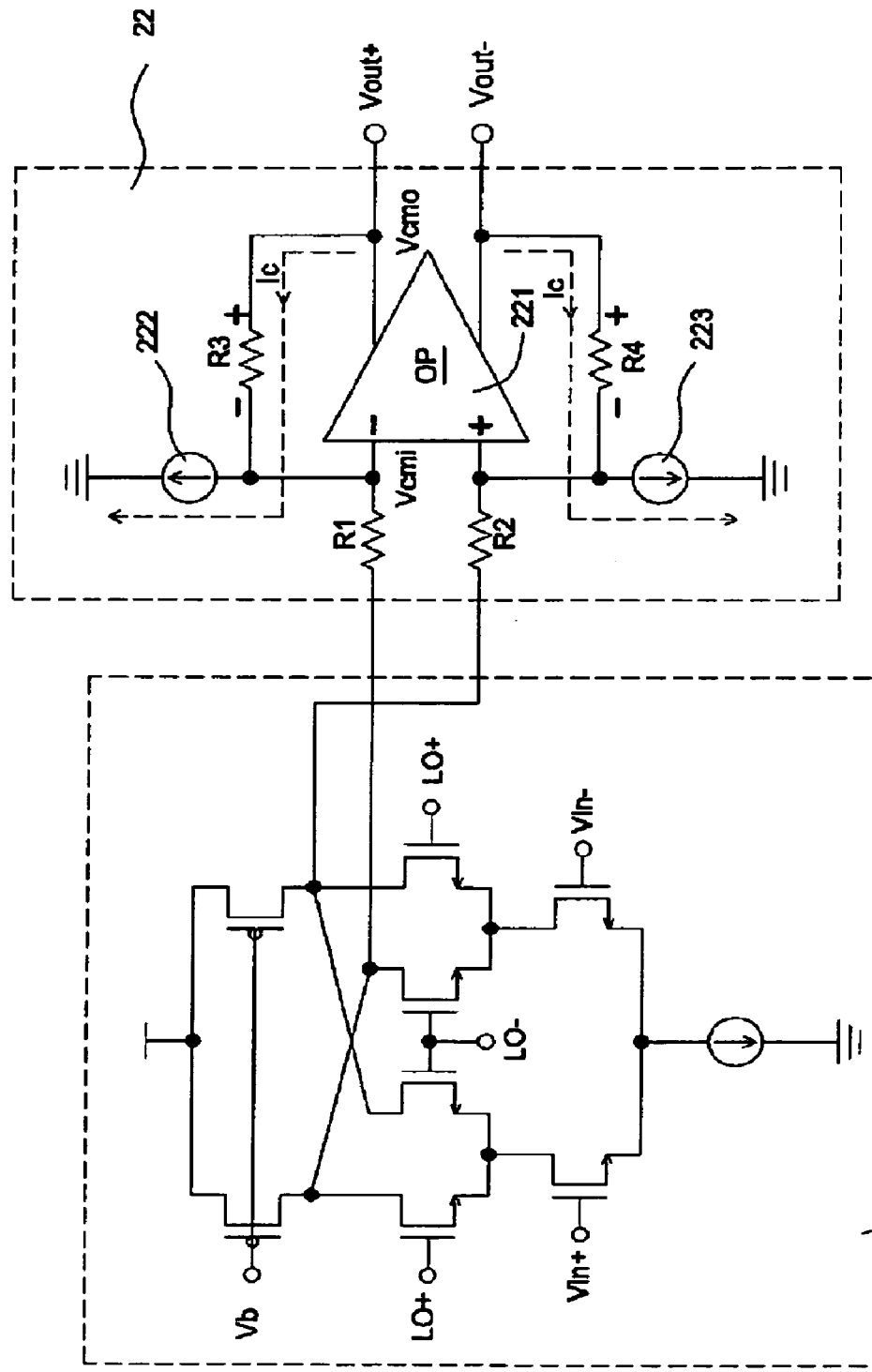
FIG. 3 is a schematic diagram of a circuit apparatus having unequal input/output common mode voltages used in a mixer according to another embodiment of the invention.
Figure 4:
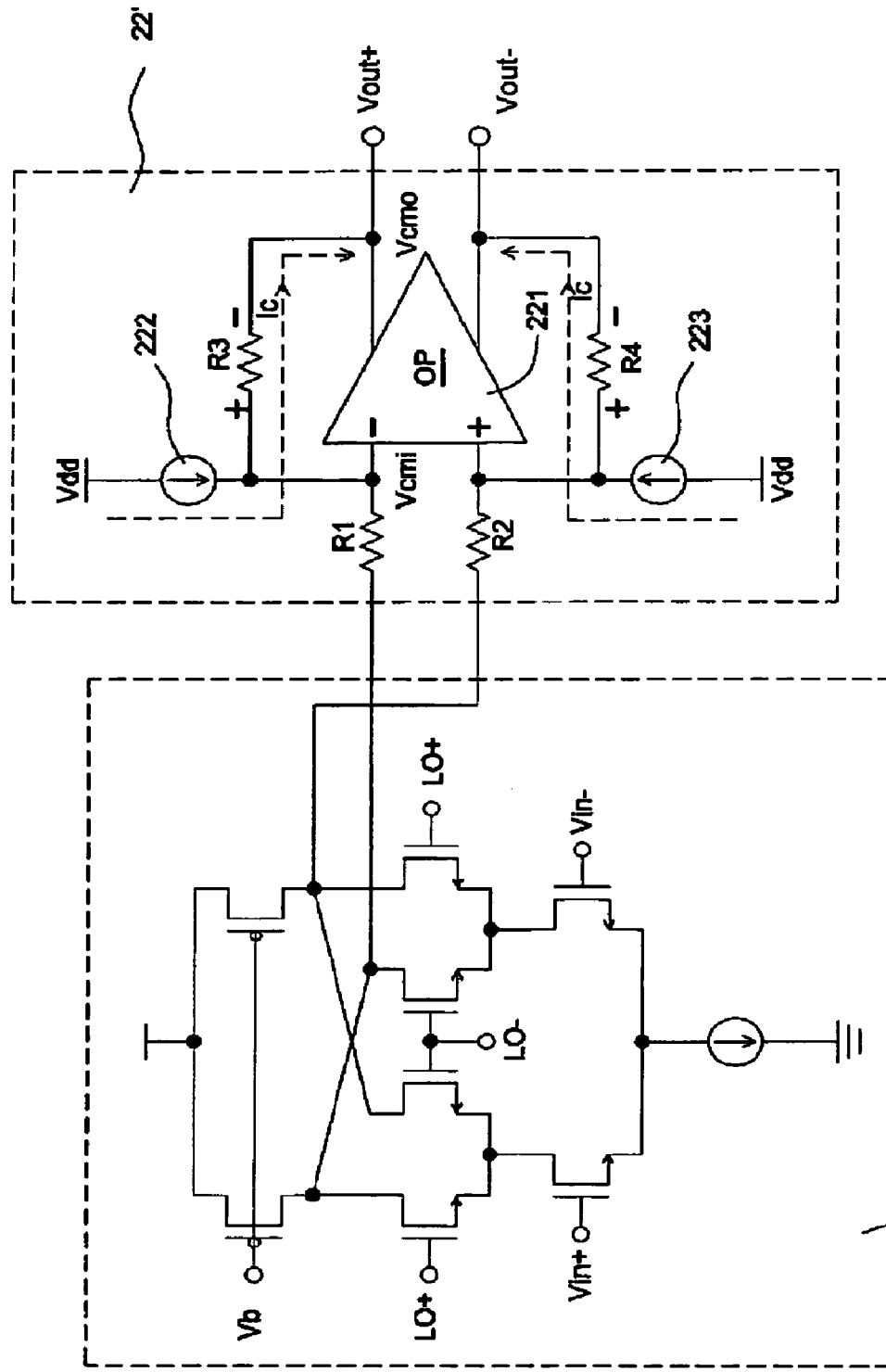
FIG. 4 is a schematic diagram of a circuit apparatus having unequal input/output common mode voltages used in a mixer according to another embodiment of the invention.

Please refer to FIG. 3 and FIG. 4 for a full view of the application proposed in this embodiment. Since the details are very similar to the aforementioned techniques illustrated in FIG. 1 and FIG. 2, those who are skilled in the art would have no problem in realizing the circuits required.

It should be noted that as any one skilled in the art should know, the current sources 222 and 223 in FIGS. 1, 2, 3, and 4 can be resistors, current mirrors which are composed of MOS transistors, or other circuits that supply controllable current.

Therefore, as shown in FIGS. 1, 2, 3, and 4, the circuit apparatuses 22, 22' can still operate under unequal input and output common mode voltages, that is, to work without using an AC coupling capacitor or a buffer.

Figure 5:
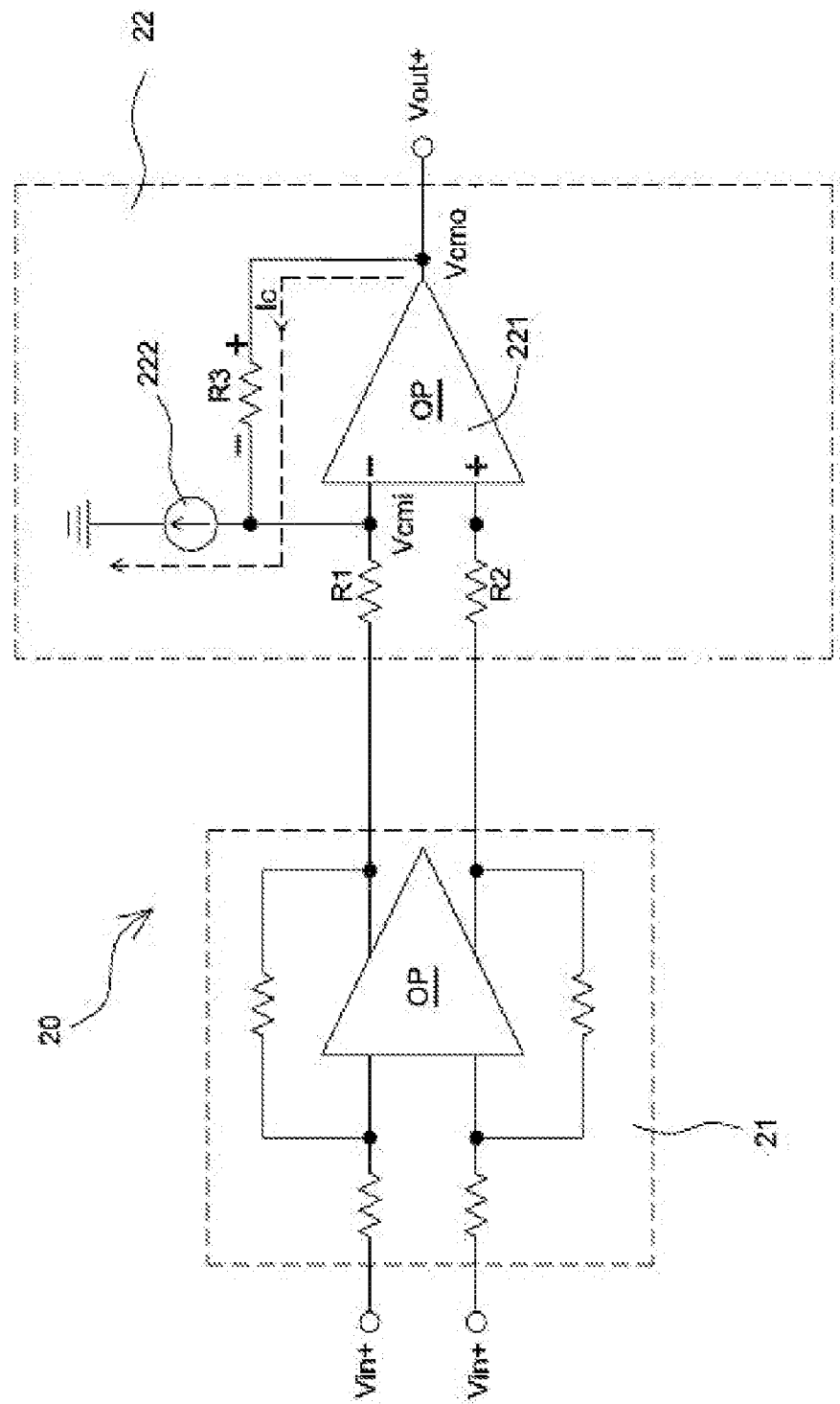
FIG. 5 and FIG. 6 illustrate single-ended amplifiers.
Figure 6:
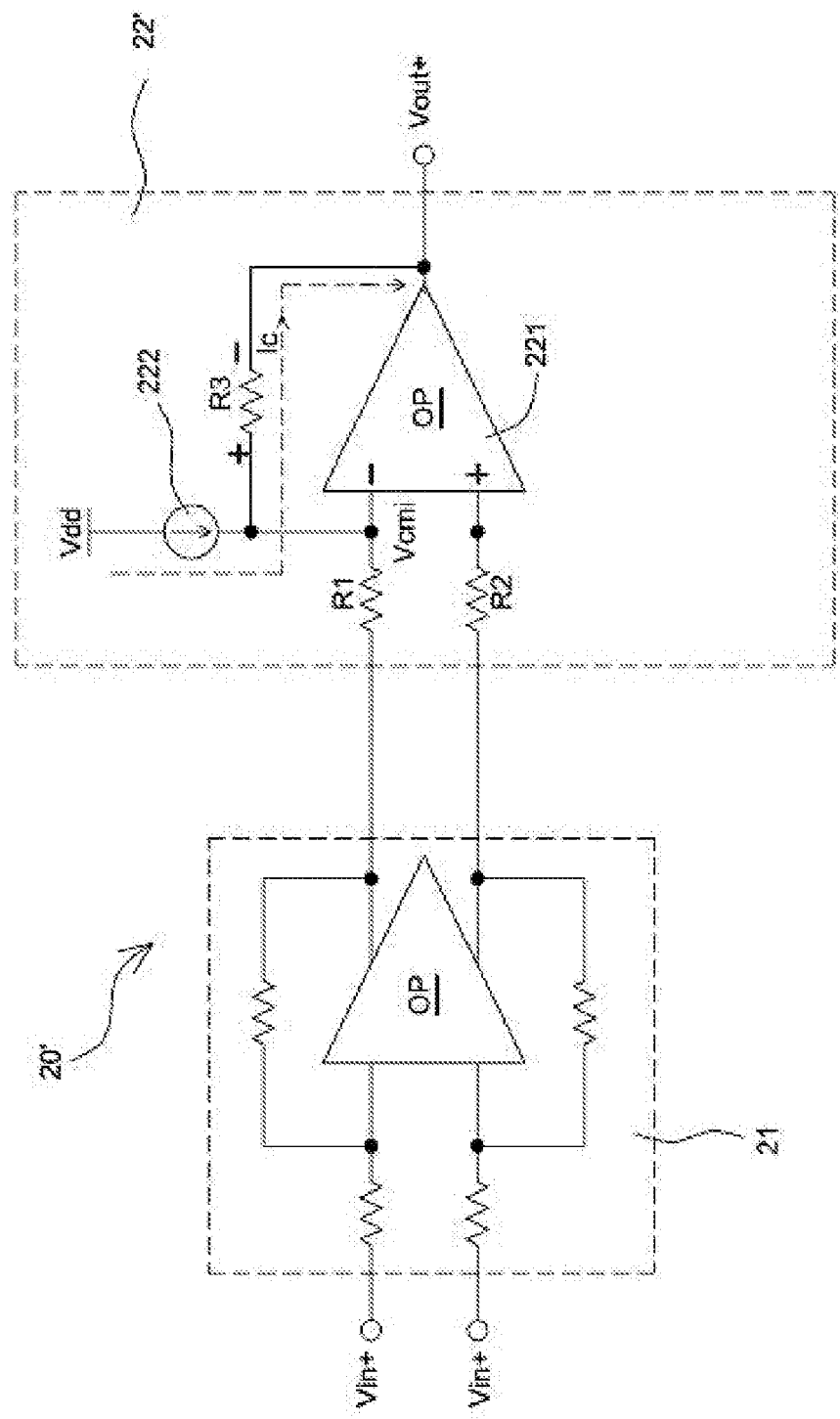

Although the example was demonstrated with a differential amplifier circuit, skills described in the embodiment of the invention can also be applied to a single-ended amplifier (such as the embodiments shown in FIG. 5 and FIG. 6), or any other circuits that require operation with unequal input/output common mode voltages.

While the invention has been described by way of example and in terms of a preferred embodiment, it is to be understood that the invention is not limited thereto. On the contrary, it is intended to cover unequal modifications and similar arrangements and procedures, and the scope of the appended claims therefore should be accorded the broadest interpretation so as to encompass all such modifications and similar arrangements and procedures.

What is claimed is:

1. A circuit apparatus having compensation circuits for unequal input/output common mode voltages, comprising:
   an operational amplifier, having at least an input terminal for receiving an input signal and at least an output terminal for generating an output signal, wherein the common mode voltage of said input terminal is higher than the common mode voltage of said output terminal;
   a feedback impedance, coupled between said input terminal and said output terminal; and
   a current source, supplying a current, said current passes through said feedback impedance, a first terminal of said current source coupled to said input terminal of said operational amplifier and said feedback impedance, and a second terminal coupled to a supply voltage source.

2. The circuit apparatus according to claim 1, wherein said operational amplifier is a differential amplifier.

3. The circuit apparatus according to claim 1, wherein said operational amplifier is a single-ended amplifier.

4. A circuit apparatus having compensation circuits for unequal input/output common mode voltages, comprising:
   a single-ended operational amplifier, having at least an input terminal for receiving an input signal, and an output terminal for generating an output signal, wherein the common mode voltage of said input terminal is lower than the common mode voltage of said output terminal;
   a feedback impedance, coupled between said input terminal and said output terminal; and
   a current source, supplying a current, said current passes through said feedback impedance, a first terminal of said current source coupled to said input terminal of said operational amplifier and said feedback impedance, and a second terminal coupled to a voltage source.

5. The circuit apparatus according to claim 4, wherein said voltage source is a ground source.

6. A circuit apparatus having compensation circuits for unequal input/output common mode voltages, comprising:
   a circuit unit, comprising a single-ended amplifier, having at least an input terminal for receiving an input signal and at least an output terminal for generating an output signal, said input terminal having an input common mode voltage and said output terminal having an output common mode voltage;
   a feedback path, coupled between said output terminal and said input terminal; and
   a current source, coupled to said input terminal to supply a current;
   wherein voltage drop generated at said feedback path compensates the difference between said input common mode voltage and said output common mode voltage.

7. The circuit apparatus according to claim 6, wherein equivalent input resistance of said circuit unit is ten times larger than equivalent resistance of said feedback path.

8. The circuit apparatus according to claim 6, wherein said feedback path comprises a resistor or a plurality of resistors.

9. A circuit apparatus having compensation circuits for unequal input/output common mode voltages, comprising:
   a single-ended operational amplifier, having at least an input terminal for receiving an input signal and at least an output terminal for generating an output signal, wherein the common mode voltage of said input terminal is higher than the common mode voltage of said output terminal;
   a feedback impedance, coupled between said input terminal and said output terminal; and
   a current source, supplying a current, said current passes through said feedback impedance, a first terminal of said current source coupled to said input terminal of said operational amplifier and said feedback impedance, and a second terminal coupled to a voltage source.

10. A circuit apparatus having compensation circuits for unequal input/output common mode voltages, comprising:
    a circuit unit, having at least an input terminal for receiving an input signal and at least an output terminal for generating an output signal, said input terminal having an input common mode voltage and said output terminal having an output common mode voltage;
    a feedback path, coupled between said output terminal and said input terminal; and
    a current source, coupled to said input terminal to supply a current;
    wherein voltage drop generated at said feedback path compensates the difference between said input common mode voltage and said output common mode voltage and equivalent input resistance of said circuit unit is at least ten times larger than equivalent resistance of said feedback path.

11. The circuit apparatus according to claim 10, wherein said circuit unit comprises an operational amplifier.

12. The circuit apparatus according to claim 10, wherein said circuit unit comprises a differential amplifier.

13. The circuit apparatus according to claim 10, wherein said feedback path comprises a resistor or a plurality of resistors.

* * * * *